(12) United States Patent
Ramaraju et al.

(10) Patent No.: US 8,319,548 B2
(45) Date of Patent: Nov. 27, 2012

(54) INTEGRATED CIRCUIT HAVING LOW POWER MODE VOLTAGE REGULATOR

(75) Inventors: Ravindraraj Ramaraju, Round Rock, TX (US); David R. Bearden, Austin, TX (US); Kenneth R. Burch, Austin, TX (US); Charles E. Seaberg, Austin, TX (US); Hector Sanchez, Cedar Park, TX (US); Bradley J. Garni, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 320 days.

(21) Appl. No.: 12/622,277

(22) Filed: Nov. 19, 2009

(65) Prior Publication Data
US 2010/0207688 A1  Aug. 19, 2010

Related U.S. Application Data

(63) Continuation-in-part of application No. 12/372,997, filed on Feb. 18, 2009, now Pat. No. 7,825,720.

(51) Int. Cl.
*G05F 1/10* (2006.01)
(52) U.S. Cl. ........................................ 327/544; 327/540
(58) Field of Classification Search ................... 327/544
See application file for complete search history.

(56) References Cited

U.S. PATENT DOCUMENTS

| | | | |
|---|---|---|---|
| 4,585,955 A | 4/1986 | Uchida | |
| 4,714,845 A | 12/1987 | Devecchi et al. | |
| 4,780,854 A * | 10/1988 | Watanabe et al. | 365/226 |
| 4,868,483 A | 9/1989 | Tsujimoto | |
| 5,430,682 A | 7/1995 | Ishikawa et al. | |
| 5,552,740 A | 9/1996 | Casper | |
| 5,619,164 A * | 4/1997 | Tomishima | 327/541 |
| 5,821,769 A * | 10/1998 | Douseki | 326/34 |
| 5,956,278 A * | 9/1999 | Itou | 365/201 |
| 5,986,923 A | 11/1999 | Zhang et al. | |
| 6,060,944 A * | 5/2000 | Casper | 327/541 |
| 6,087,893 A * | 7/2000 | Oowaki et al. | 327/537 |
| 6,111,394 A | 8/2000 | Casper | |
| 6,111,934 A | 8/2000 | Foerst et al. | |

(Continued)

OTHER PUBLICATIONS

Nii et al., "A 90 NM Low Power 32K-Byte Embedded SRAM With Gate Leakage Suppression Circuit for Mobile Applications", 2003 Symposium on VLSI Circuits Digest of Technical Papers, 2003, pp. 247-250, IEEE.

(Continued)

*Primary Examiner* — Thomas J Hiltunen
(74) *Attorney, Agent, or Firm* — Daniel D. Hill; Joanna G. Chiu

(57) ABSTRACT

A voltage regulator regulates voltage at a node and has circuitry coupled to the node for providing a current to the node. A regulating transistor coupled between the node and a first power supply voltage terminal has a disabling transistor coupled in parallel and is selectively disabled by directly connecting the first power supply voltage terminal to the node. An inverting stage has an output connected to the regulating transistor. A load transistor has a first current electrode coupled to a second power supply voltage terminal, and a control electrode and second current electrode connected together and coupled to an input of the inverting stage. A sensing transistor has a first current electrode coupled to the second current electrode of the load transistor, a control electrode connected directly to the node and a second current electrode coupled to the first power supply voltage terminal.

11 Claims, 5 Drawing Sheets

U.S. PATENT DOCUMENTS

| | | | |
|---|---|---|---|
| 6,114,843 A * | 9/2000 | Olah | 323/280 |
| 6,177,826 B1 * | 1/2001 | Mashiko et al. | 327/534 |
| 6,236,666 B1 * | 5/2001 | Mirov et al. | 372/23 |
| 6,281,744 B1 | 8/2001 | Kang | |
| 6,380,799 B1 | 4/2002 | Chung et al. | |
| 6,414,883 B2 * | 7/2002 | Hidaka et al. | 365/189.11 |
| 6,441,663 B1 | 8/2002 | Chuang et al. | |
| 6,509,786 B2 | 1/2003 | Uekubo | |
| 6,560,139 B2 | 5/2003 | Ma et al. | |
| 6,614,706 B2 * | 9/2003 | Feurle | 365/226 |
| 6,737,910 B2 * | 5/2004 | Kitagawa et al. | 327/541 |
| 6,775,112 B1 * | 8/2004 | Smith et al. | 361/18 |
| 6,836,179 B2 | 12/2004 | Mizuno et al. | |
| 6,861,901 B2 | 3/2005 | Prexi et al. | |
| 6,906,582 B2 | 6/2005 | Kase et al. | |
| 6,909,320 B2 | 6/2005 | Chan et al. | |
| 6,933,772 B1 | 8/2005 | Banerjee et al. | |
| 7,026,802 B2 * | 4/2006 | Gradinariu | 323/316 |
| 7,064,601 B2 | 6/2006 | Kwak et al. | |
| 7,091,712 B2 | 8/2006 | Miller et al. | |
| 7,099,230 B1 | 8/2006 | Tran | |
| 7,110,317 B2 | 9/2006 | Song et al. | |
| 7,125,842 B2 | 10/2006 | Kawabe et al. | |
| 7,126,370 B2 * | 10/2006 | Bhattacharya | 326/33 |
| 7,126,861 B2 | 10/2006 | Hose, Jr. et al. | |
| 7,135,842 B2 | 11/2006 | Banerjee et al. | |
| 7,164,291 B2 * | 1/2007 | Mair et al. | 326/83 |
| 7,208,974 B1 | 4/2007 | Chui | |
| 7,218,168 B1 * | 5/2007 | Rahman | 327/540 |
| 7,235,959 B2 | 6/2007 | Sicard | |
| 7,253,595 B2 | 8/2007 | Oddoart et al. | |
| 7,268,524 B2 | 9/2007 | Kase et al. | |
| 7,292,495 B1 | 11/2007 | Kenkare et al. | |
| 7,332,954 B2 * | 2/2008 | Ryu et al. | 327/534 |
| 7,339,416 B2 | 3/2008 | Rincon-Mora et al. | |
| 7,342,845 B2 * | 3/2008 | Somasekhar et al. | 365/229 |
| 7,372,764 B2 * | 5/2008 | Nautiyal et al. | 365/229 |
| 7,400,123 B1 * | 7/2008 | Voogel | 323/280 |
| 7,414,457 B2 | 8/2008 | Ogawa et al. | |
| 7,423,416 B1 | 9/2008 | Quinones et al. | |
| 7,432,693 B2 | 10/2008 | Enjalbert | |
| 7,439,718 B2 | 10/2008 | Rozen et al. | |
| 7,441,137 B1 | 10/2008 | Mimberg | |
| 7,463,013 B2 | 12/2008 | Plojhar | |
| 7,479,824 B2 | 1/2009 | Bushman et al. | |
| 7,554,312 B2 | 6/2009 | Fulton et al. | |
| 7,576,594 B2 | 8/2009 | Shozo | |
| 7,619,440 B2 | 11/2009 | Amedeo et al. | |
| 7,701,755 B2 | 4/2010 | Chen et al. | |
| 7,737,720 B2 * | 6/2010 | Idgunji et al. | 326/33 |
| 7,750,610 B2 * | 7/2010 | Vorenkamp | 323/272 |
| 7,760,009 B2 * | 7/2010 | Yang et al. | 327/534 |
| 7,808,856 B2 * | 10/2010 | Ehrenreich et al. | 365/229 |
| 7,821,814 B2 * | 10/2010 | Yamaoka et al. | 365/154 |
| 7,825,720 B2 | 11/2010 | Ramaraju et al. | |
| 7,863,971 B1 * | 1/2011 | Nayak et al. | 327/546 |
| 8,085,579 B2 * | 12/2011 | Inoue | 365/154 |
| 2007/0001223 A1 * | 1/2007 | Boyd et al. | 257/347 |
| 2007/0210855 A1 * | 9/2007 | Raimar | 327/538 |
| 2007/0229147 A1 * | 10/2007 | Doyle et al. | 327/540 |
| 2007/0252623 A1 * | 11/2007 | Zampaglione et al. | 327/74 |
| 2008/0001655 A1 * | 1/2008 | Pham et al. | 327/544 |
| 2008/0074176 A1 * | 3/2008 | Yamamoto | 327/544 |
| 2008/0170458 A1 * | 7/2008 | Haid et al. | 365/227 |
| 2008/0284504 A1 * | 11/2008 | Hirota et al. | 327/544 |
| 2009/0045677 A1 * | 2/2009 | Frey et al. | 307/38 |
| 2009/0066388 A1 | 3/2009 | Park | |
| 2009/0096433 A1 | 4/2009 | Gerber et al. | |
| 2009/0237125 A1 | 9/2009 | Zhao et al. | |
| 2010/0123515 A1 * | 5/2010 | Sasaki et al. | 327/540 |
| 2011/0221516 A1 * | 9/2011 | Yamaoka et al. | 327/538 |

OTHER PUBLICATIONS

Tschanz et al., "Dynamic Sleep Transistor and Body Bias for Active Leakage Power Control Microprocessors", IEEE Journal of Solid State Circuits, Nov. 2003, pp. 1838-1845, vol. 38, No. 11, IEEE.

Bhavnagarwala, et al., "A Pico-Joule Class, 1 GHZ, 32 Kbyte X 64B DSP SRAM With Self Reverse Bias", 2003 Symposium of VLSI Circuits Digest of Technical Papers, 2003, pp. 251-252, IEEE.

Chang, et al., "The 65 NM 16-MB Shared On-Die L3 Cache for the Dual-Core Intel Xeon Processor 7100 Series", IEEE Journal of Solid-State Circuits, Apr. 2007, pp. 846-852, vol. 42, No. 4.

Vangal, et al., "An 80-Tile Sub-100-W Teraflops Processor in 65-NM CMOS", IEEE Journal of Solid-State Circuits, Jan. 2008, pp. 29-41, vol. 43, No. 1.

Wang et al.; "A 4.0 GHz 291Mb Voltage-Scalable SRAM Design in 32nm High-K Metal-Gate CMOS with Integrated Power Management"; ISSCC 2009 Digest of Technical Papers; Feb. 11, 2009; pp. 456-457 & Continuation Page; IEEE.

Khellah et al.; "A 256-Kb Dual-Vcc SRAM Building Block in 65-nm CMOS Process With Actibely Clamped Sleep Transistor"; IEEE Journal of Solid-State Circuits; Jan. 2007; pp. 233-242; vol. 42, No. 1; IEEE.

Sackinger et al.; "A High-Swing, High-Impedance MOS Cascode Circuit"; IEEE Journal of Solid-State Circuits; Feb. 1990; pp. 289-298; vol. 24, No. 1; IEEE.

Notice of Allowance mailed Aug. 4, 2010 in U.S. Appl. No. 12/372,997.

Chen et al.; "A 0.6 V Dual-Rail Compiler SRAM Design on 45 nm CMOS Technology With Adaptive SRAM Power for Lower VDD_min VLSIs"; IEEE Journal of Solid-State Circuits; Apr. 2009; pp. 1209-1215; vol. 44, No. 4; IEEE.

Office Action mailed Apr. 27, 2010 in U.S. Appl. No. 12/372,997.

U.S. Appl. No. 12/843,547, Ramaraju, R., et al., "Integrated Circuit Having Low Power Mode Voltage Regulator", Office Action-Rejection, dated Apr. 13, 2012.

U.S. Appl. No. 12/714,079, Russell, A., "Integrated Circuit Having Variable Memory Array Power Supply Voltage", Office Action-Notice of Allowance, dated May 2, 2012.

U.S. Appl. No. 12/843,547, Inventor Ramaraju et al, "Integrated Circuit Having Low Power Mode Voltage Regulator", filed Jul. 26, 2010, Office Action—Final Rejection, mailed Aug. 8, 2012.

* cited by examiner

INTEGRATED CIRCUIT HAVING LOW POWER MODE VOLTAGE REGULATOR

CROSS-REFERENCE TO RELATED APPLICATION

This application is a continuation-in-part of U.S. patent application Ser. No. 12/372,997 by Ramaraju et al., filed Feb. 18, 2009 now U.S. Pat. No. 7,825,720, and entitled "Circuit For A Low Power Mode".

BACKGROUND

1. Field

This disclosure relates generally to integrated circuits, and more specifically, to an integrated circuit having a low power mode voltage regulator.

2. Related Art

Lower power consumption has been gaining importance in integrated circuits due to, for example, wide spread use of portable and handheld applications. Most circuits in handheld devices are typically off, for example, in an idle or deep sleep mode, for a significant portion of time, consuming only leakage power. As transistor leakage currents increase with finer geometry manufacturing processes, it becomes more difficult to meet chip leakage targets using traditional power reduction techniques. Therefore, reducing leakage current is becoming an increasingly important factor in extending battery life.

There are several methods for reducing leakage currents of integrated circuits during a low power mode. One method involves providing a "virtual" ground terminal that can be at ground potential during a normal operating mode and then increased above ground during a low power operating mode to reduce the leakage current. However, as power supply voltages decrease, it becomes more important to maintain the increased voltage on the virtual ground terminal during the low power operating mode very accurately.

BRIEF DESCRIPTION OF THE DRAWINGS

The various embodiments are illustrated by way of example and are not limited by the accompanying figures, in which like references indicate similar elements. Elements in the figures are illustrated for simplicity and clarity and have not necessarily been drawn to scale.

DETAILED DESCRIPTION

Figure 1:
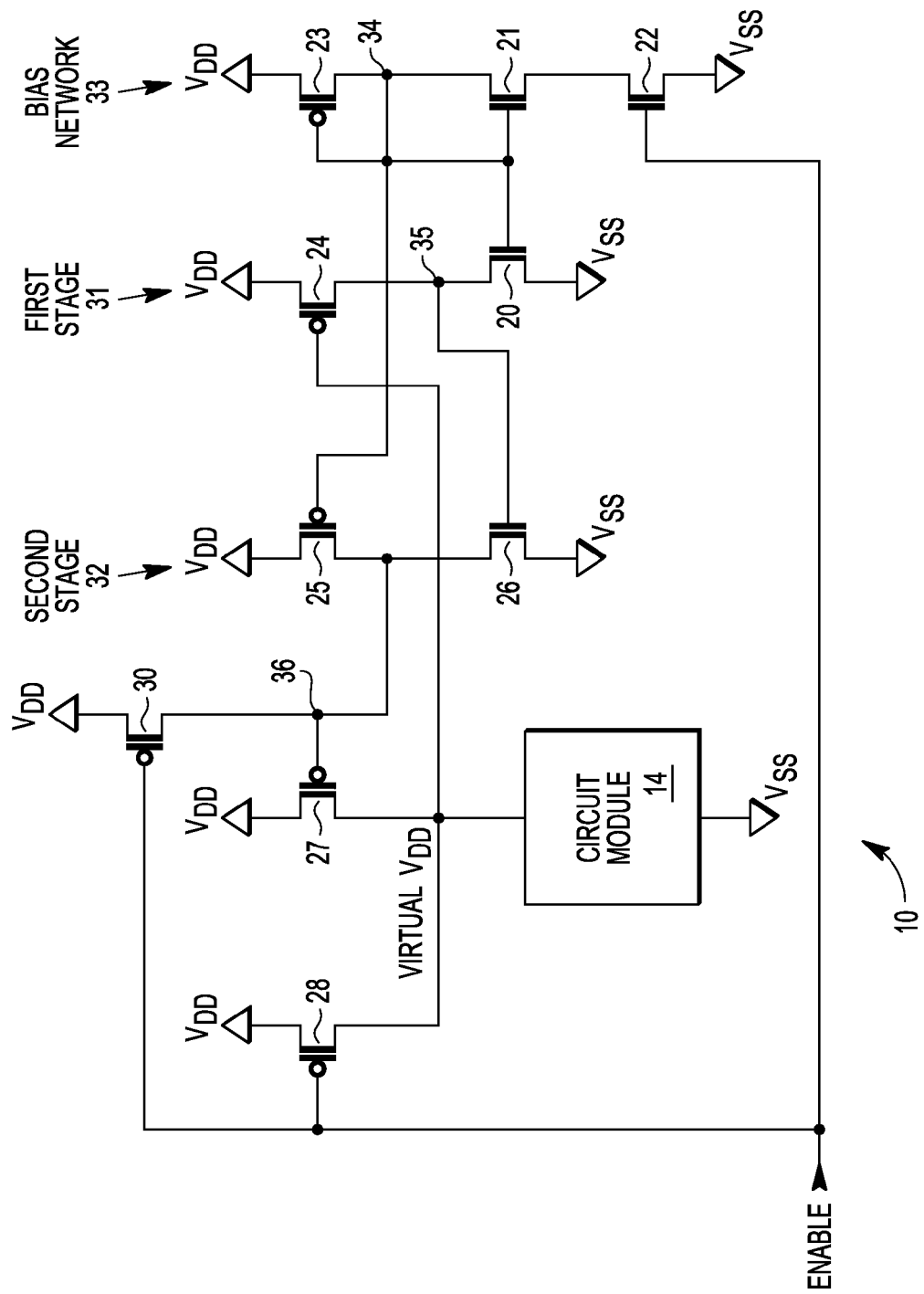
FIG. 1 illustrates in schematic form a circuit for voltage control in a semiconductor having a low power mode in accordance with an embodiment.

In one aspect, there is provided, a voltage regulator (210, 210', 236), comprising: a node (N3); circuitry (212) coupled to the node (N3) for providing a current to the node; a regulating transistor (226) coupled between the node and a first power supply voltage terminal (VSS); a disabling transistor (216) coupled in parallel with the regulating transistor (226) for selectively disabling the regulating transistor by directly connecting the first power supply voltage terminal to the node; an inverting stage (221) coupled between the first power supply voltage terminal and a second power supply voltage terminal (VDD), the inverting stage (221) having an output connected to a control terminal of the regulating transistor (226), the inverting stage having an input; a load transistor (220) having a first current electrode coupled to the second power supply voltage terminal, and a control electrode and second current electrode connected together and coupled to the input of the inverting stage; and a sensing transistor (218) having a first current electrode coupled to the second current electrode of the load transistor, a control electrode connected directly to the node and a second current electrode coupled to the first power supply voltage terminal. The inverting stage may further comprise: a first inverting stage transistor (222) having a first current electrode coupled to the second power voltage terminal, a control electrode coupled to both the control electrode and second current electrode of the load transistor, and a second current electrode; and a second inverting stage transistor (224) having a first current electrode connected to a control electrode thereof and to a control electrode of the regulating transistor for controlling the regulating transistor, the second inverting stage transistor having a second current electrode coupled to the first power supply voltage terminal. The voltage regulator may further comprise: an additional sensing transistor (232) having a first current electrode coupled to the first current electrode of the sensing transistor, a control electrode connected to the node, and a second current electrode; and a mode select transistor (234) having a first current electrode coupled to the second current electrode of the additional sensing transistor, a control electrode for receiving a mode control signal which selects one of a plurality of voltage amounts for voltage at the node to change when the disabling transistor is not disabling the regulating transistor, and a second current electrode coupled to the first power supply voltage terminal. The control electrode of the additional sensing transistor may be connected to a body of the additional sensing transistor. The current provided by the circuitry may be a leakage current which occurs during a low power operating mode. The inverting stage may further comprise: a first inverting stage transistor (250) having a first current electrode coupled to the second power voltage terminal, a control electrode, and a second current electrode; and a second inverting stage transistor (252) having a first current electrode coupled to the second current electrode of the first inverting stage transistor and to the control electrode of the regulating transistor for controlling the regulating transistor, a control electrode coupled to the control electrode of the first inverting stage transistor, and a second current electrode coupled to the first power supply voltage terminal (VSS). The disabling transistor and the sensing transistor may be N-type conductivity transistors, the load transistor may be a P-type conductivity transistor, and a first supply voltage coupled to the first supply voltage terminal may be less positive than a second supply voltage coupled to the second power supply voltage terminal. The first power supply voltage terminal may be a ground reference terminal. The regulating transistor, disabling transistor, load transistor and sensing transistor may be silicon-on-insulator (SOI) transistors and the inverting stage may be implemented with SOI transistors.

In another aspect, there is provided, a voltage regulator (210, 210', or 236), comprising: a node (N3); circuit means (212) coupled to the node for providing a current to the node;

regulating transistor means (226) coupled between the node and a first power supply voltage terminal (VSS); disabling transistor means (216) coupled in parallel with the regulating transistor means for selectively disabling the regulating transistor means by directly connecting the first power supply voltage terminal to the node; inverter means coupled between the first power supply voltage terminal and a second power supply voltage terminal, the inverter means (221) having an output connected to a control terminal of the regulating transistor means, the inverter means having an input; load transistor means (220) having a first current electrode coupled to the second power supply voltage terminal, and a control electrode and second current electrode connected together and coupled to the input of the inverter means; and sensing transistor means (218) having a first current electrode coupled to the second current electrode of the load transistor means, a control electrode connected directly to the node and a second current electrode coupled to the first power supply voltage terminal. The inverter means (221) may further comprise: a first inverting stage transistor (222) having a first current electrode coupled to the second power voltage terminal, a control electrode coupled to both the control electrode and second current electrode of the load transistor means, and a second current electrode; and a second inverting stage transistor (224) having a first current electrode connected to a control electrode thereof and to a control electrode of the regulating transistor means for controlling the regulating transistor means, the second inverting stage transistor having a second current electrode coupled to the first power supply voltage terminal. The voltage regulator may further comprise: additional sensing transistor means (232) having a first current electrode coupled to the first current electrode of the sensing transistor means, a control electrode connected to the node, and a second current electrode; and mode select transistor means (234) having a first current electrode coupled to the second current electrode of the additional sensing transistor means, a control electrode for receiving a mode control signal which selects one of a plurality of voltage amounts for voltage at the node to change when the disabling transistor means is not disabling the regulating transistor means, and a second current electrode coupled to the first power supply voltage terminal. The control electrode of the additional sensing transistor means may be connected to a body of the additional sensing transistor means. The inverter means (248) may further comprise: a first inverting stage transistor (250) having a first current electrode coupled to the second power supply voltage terminal, a control electrode, and a second current electrode; and a second inverting stage transistor (252) having a first current electrode coupled to the second current electrode of the first inverting stage transistor and to the control electrode of the regulating transistor means for controlling the regulating transistor means, a control electrode coupled to the control electrode of the first inverting stage transistor, and a second current electrode coupled to the first power supply voltage terminal.

In yet another embodiment, there is provided, a voltage regulator circuit (210) comprising: a node (N3); circuitry (212) coupled to the node for providing a current to the node; a first transistor (226) of a first conductivity type coupled between the node and a first power supply voltage terminal for regulating voltage at the node; a second transistor (216) of the first conductivity type coupled in parallel with the first transistor for selectively disabling the first transistor by directly connecting the first power supply voltage terminal (VSS) to the node; an inverting stage (221 or 248) coupled between the first power supply voltage terminal (VSS) and a second power supply voltage terminal (VDD), the inverting stage having an output connected to a control terminal of the first transistor, the inverting stage having an input; a third transistor (220) of a second conductivity type that is opposite the first conductivity type, the third transistor having a first current electrode coupled to the second power supply voltage terminal, and a control electrode and second current electrode connected together and coupled to the input of the inverting stage; and a fourth transistor (218) of the first conductivity type having a first current electrode coupled to the second current electrode of third transistor, a control electrode connected directly to the node and a second current electrode coupled to the first power supply voltage terminal. The inverting stage may further comprise: a fifth transistor (222) of the second conductivity type having a first current electrode coupled to the second power supply voltage terminal, a control electrode coupled to the control electrode of the third transistor, and a second current electrode; and a sixth transistor (224) of the first conductivity type having a first current electrode coupled to the second current electrode of the fifth transistor and to a control electrode thereof for providing the output of the inverting stage, and a second current electrode coupled to the first power supply voltage terminal. The inverting stage (248) may further comprise: a fifth transistor (250) of the second conductivity type having a first current electrode coupled to the second power supply voltage terminal, a control electrode to provide the input of the inverting stage and being coupled to the control electrode of the third transistor, and a second current electrode; and a sixth transistor (252) of the first conductivity type having a first current electrode coupled to the second current electrode of the fifth transistor for providing the output of the inverting stage, a control electrode coupled to the control electrode of the fifth transistor, and a second current electrode coupled to the first power supply voltage terminal. The current provided by the circuitry may be a leakage current which occurs during a low power operating mode. The voltage regulator circuit may further comprise: a fifth transistor (232) of the first conductivity type having a first current electrode coupled to the second current electrode of the third transistor, a control electrode coupled to the control electrode of the fourth transistor and to the node, and a second current electrode; and a sixth transistor (234) of the first conductivity type having a first current electrode coupled to the second current electrode of the fifth transistor, a control electrode for receiving a mode signal which selects one of a plurality of voltage amounts for voltage at the node to change when the second transistor is not conductive, and a second current electrode coupled to the first supply voltage terminal. The control electrode of at least one of the fourth transistor and the fifth transistor is directly connected to a body thereof.

Illustrated in FIG. 1 is circuitry for providing an operating voltage when having a low power or idle mode of operation. Circuit 10 implements a voltage regulating function to accurately maintain a reduced operating voltage without requiring circuitry that itself uses a significant amount of power or requires a significant amount of area. In the illustrated form the circuit 10 has a first stage 31 and a second stage 32 that are biased by a bias network 33. Bias network 33 has a P-channel transistor 23 having a first current electrode or source connected to a voltage terminal for receiving a $V_{DD}$ power supply voltage. A control electrode or gate and a second current electrode or drain of transistor 23 are connected together at a node 34 to form a diode-connected transistor 23. The drain of transistor 23 is connected to a drain of an N-channel transistor 21. A gate of transistor 21 is connected to the gate of transistor 23 at node 34. A source of transistor 21 is connected to a drain of an N-channel transistor 22. A source of transistor 22 is connected to a power supply terminal for receiving a voltage $V_{SS}$. In one form the $V_{SS}$ is an earth ground potential, but in other forms the $V_{SS}$ voltage may be other voltage values including negative voltages. Regardless of the value of $V_{SS}$, the power supply voltage $V_{DD}$ is a more positive voltage than $V_{SS}$. The first stage 31 has a P-channel transistor 24 having a source connected to a power supply voltage terminal for receiving the $V_{DD}$ supply voltage. A gate of transistor 24 is connected to a Virtual $V_{DD}$ node, and a drain of transistor 24 is connected to a drain of an N-channel transistor 20 at a node 35. A gate of transistor 20 is connected to the gates of transistors 21 and 23 at node 34. A source of transistor 20 is connected to a voltage terminal for receiving the $V_{SS}$ voltage. The second stage 32 has a P-channel transistor 25 having a source connected to a terminal for receiving the $V_{DD}$ supply voltage. A gate of transistor 25 is connected to the gates of transistors 21 and 23 and the drain of transistor 23 at the node 34. A drain of transistor 25 is connected to a drain of an N-channel transistor 26 at a node 36. A gate of transistor 26 is connected to the drain of transistor 20 at a node 35, and a source of transistor 26 is connected to a voltage terminal for receiving the $V_{SS}$ voltage. A P-channel transistor 27 has a source connected to a terminal for receiving the $V_{DD}$ supply voltage, a gate connected to the node 36 and a drain connected to the virtual $V_{DD}$ node. A circuit module 14 has a first power supply terminal connected to the virtual $V_{DD}$ node. A second power supply terminal of the circuit module 14 is connected to a voltage terminal for receiving the $V_{SS}$ voltage. The circuit module 14 may be any of a wide variety of types of electronic circuits. For example, circuit module 14 may be digital logic circuitry, a state element such as one or more flip-flops, a memory element such as a cache, a processing unit or a core in a system-on-chip (SOC) or a sea of gates for implementing a logic function. A P-channel transistor 28 has a source connected to a terminal for receiving the $V_{DD}$ supply voltage. A gate of transistor 28 is connected to the gate of a P-channel transistor 30 for receiving an Enable signal. The gate of transistor 22 also receives the Enable signal. In one form the gate of transistor 22 is connected to the gate of transistor 28 and the gate of transistor 30. A drain of transistor 28 is connected to the Virtual ground node. A source of transistor 30 is connected to a terminal for receiving the $V_{DD}$ supply voltage.

In operation, circuit 10 functions to provide either a full supply voltage $V_{DD}$ or a reduced supply voltage to power the circuit module 14. The Enable signal directly determines which voltage, $V_{DD}$ or reduced $V_{DD}$ is coupled to the circuit module 14. When the enable signal is a high logic value to place circuit module 14 of circuit 10 in an idle state of operation, transistors 28 and 30 are nonconductive and transistor 22 is conductive. The idle state of operation is a "drowsy" mode or an "Idle" mode of operation in which circuit module 14 is sufficiently powered to maintain state information at a reduced $V_{DD}$ supply voltage. In this mode of operation, there is typically no normal circuit activity within circuit module 14. Thus the term "Idle mode" is herein used. Any functional activity which might occur during the Idle mode occurs at a reduced frequency. The bias network 33 is enabled and node 34 is set at a bias voltage. Transistors 21, 23 and 25 form a current mirror circuit. The current that is flowing through transistors 21 and 23 is mirrored into transistors 20 and 25. The bias voltage of bias network 33 may assume various values and is determined by the physical and electrical characteristics of transistors 21 and 23. The first stage 31 has a gain element established by transistor 24. A gate-to-source voltage, $V_{GS}$, is established across transistor 24 on the Virtual $V_{DD}$ node. Transistor 20 functions as a load (i.e. also a current source) for transistor 24. The second stage 32 has a gain element that is established by transistor 26. Transistor 25 functions as a load for transistor 26. Transistor 27 provides a control gate for the first stage 31 and second stage 32 for providing a reduced $V_{DD}$ to the Virtual $V_{DD}$ node. In this way, transistor 27 may be considered a third stage to the first stage 31 and second stage 32 with the circuit module 14 functioning as a load.

The voltage at the virtual $V_{DD}$ node is determined by the $V_{GS}$ of transistor 24. The desired voltage at the virtual $V_{DD}$ node is accomplished by the design of the physical and electrical characteristics of transistors 24 and 20. These characteristics primarily include the transistor channel dimensions and the transistor threshold voltage characteristic. During operation, if the Virtual $V_{DD}$ node drifts downward from the design's operating value, transistor 24 becomes biased stronger and the voltage at node 35 increases. This increase of voltage at node 35 biases transistor 26 stronger which in turn reduces the voltage bias applied to the gate of transistor 27 at node 36. Transistor 27 therefore is biased stronger which has the effect of increasing the voltage at the Virtual $V_{DD}$ node to counter the downward drift of voltage. If the Virtual $V_{DD}$ node drifts upward from the design's operating value, transistor 24 becomes biased weaker and the voltage at node 35 decreases. This decrease of voltage at node 35 biases transistor 26 weaker which in turn increases the voltage bias applied to the gate of transistor 27 at node 36. Transistor 27 therefore is biased less which has the effect of decreasing the voltage at the Virtual $V_{DD}$ node to counter the upward drift of voltage. These voltage relationships function as negative feedback to counter voltage changes (either up or down) at the Virtual $V_{DD}$ node. The negative feedback results from an odd number of stages wherein each stage implements a signal inversion between its input and output. The negative feedback response is determined by the loop gain of the product of the gains of the first stage 31, the second stage 32 and the transistor 27.

When the Enable signal has a low logic value, transistors 28 and 30 are conductive and transistor 22 is nonconductive. The Enable signal places the circuit module 14 in a normal mode of operation. In the normal mode of operation the full supply voltage value, $V_{DD}$, is connected to the Virtual $V_{DD}$ node by transistor 28. In this mode, the conduction of transistor 30 places the gate of transistor 27 at $V_{DD}$ to make transistor 27 nonconductive. Therefore, transistor 28 is the only transistor device connecting a voltage to the virtual $V_{DD}$ node. When transistor 22 is nonconductive, the bias voltage at node 34 is established at $V_{DD}$. The transistors 24 and 25 are nonconductive. Transistor 20 is made conductive under these operating conditions. As a result, node 35 is placed at the $V_{SS}$ potential and transistor 26 is therefore nonconductive. Since transistor 30 is conductive, the node 36 is placed at $V_{DD}$ which makes transistor 27 nonconductive. A portion of the circuit 10 remains inoperative until the Enable control signal transitions back to a logic high which indicates entrance into the Idle mode.

Figure 2:
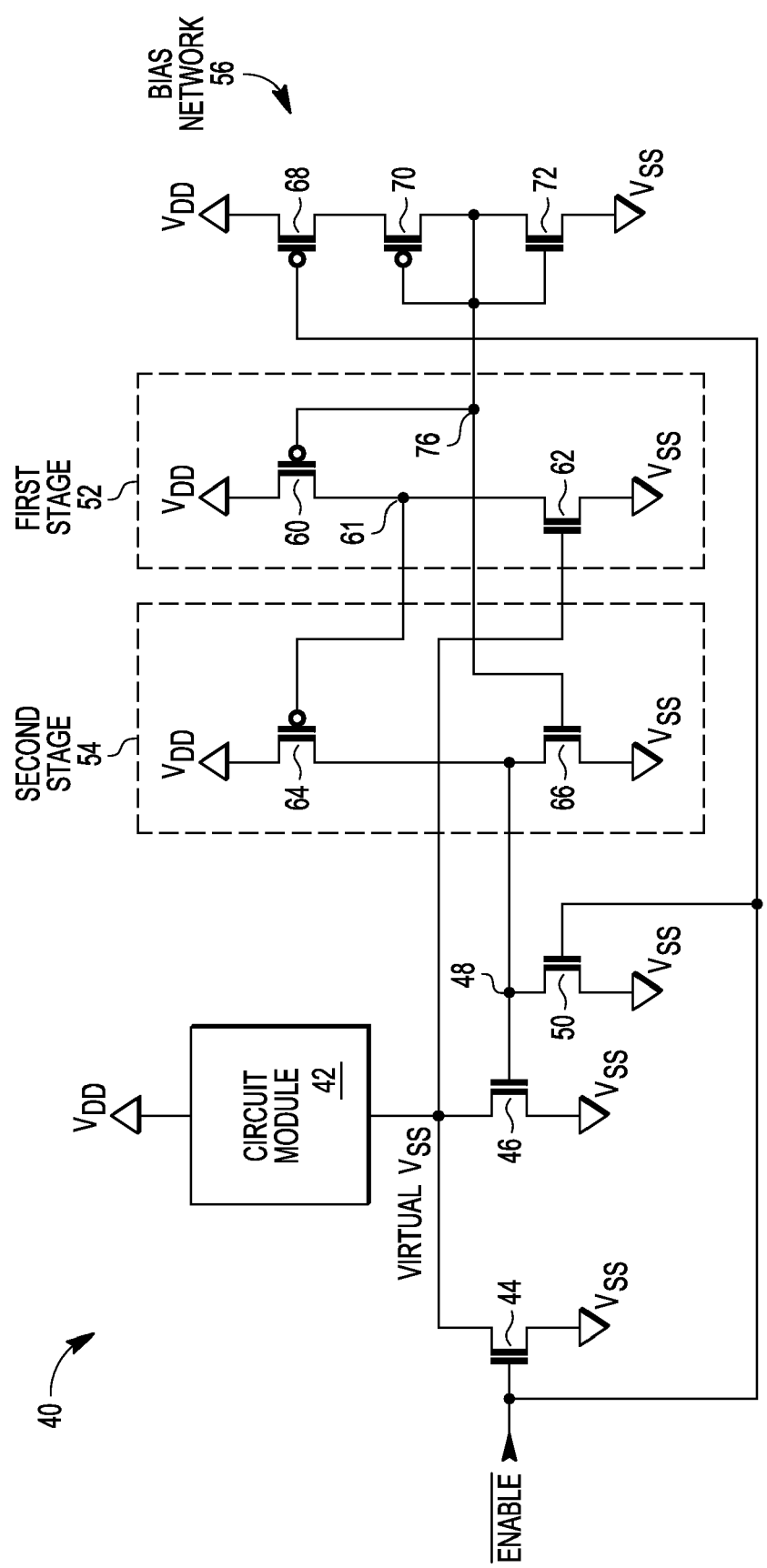
FIG. 2 illustrates in schematic form a circuit for voltage control in a semiconductor having a low power mode in accordance with another embodiment.

Illustrated in FIG. 2 is a circuit 40 for use in circuitry having a low power or idle mode of operation. Circuit 40 efficiently increases the voltage at a Virtual $V_{SS}$ terminal in response to entering an idle mode of operation wherein a positive power supply voltage $V_{DD}$ does not change in value. A circuit module 42 has a first voltage terminal connected to a terminal for receiving the $V_{DD}$ supply voltage and a second voltage terminal connected to a Virtual $V_{SS}$ terminal. A first stage 52 has a P-channel transistor 60 having a source connected to a terminal for receiving the $V_{DD}$ power supply, a gate connected to a node 76 and a drain connected to a node 61. An N-channel transistor 62 has a drain connected to the drain of transistor 60 at node 61, a gate connected to the Virtual $V_{SS}$ terminal, and a source connected to a terminal for receiving the $V_{SS}$ voltage. A second stage 54 has a P-channel transistor 64 having a source connected to a terminal for receiving the $V_{DD}$ power supply, a gate connected to node 61, and a drain connected to a drain of an N-channel transistor 66 at a node 48. A gate of transistor 66 is connected to a node 76 for receiving a bias voltage. A bias network 56 has a P-channel transistor 68 having a source connected to a terminal for receiving the $V_{DD}$ power supply, a gate for receiving an Enable signal in complementary form, and a drain. An N-channel transistor 70 has a source connected to the drain of transistor 68. A gate of transistor 70 is connected to a drain thereof at node 76 and to a drain of an N-channel transistor 72. A gate of transistor 72 is connected to the drain of transistor 72 at node 76. A source of transistor 72 is connected to a terminal for receiving the $V_{SS}$ power supply. An N-channel transistor 44 has a source connected to a terminal for receiving the $V_{SS}$ power supply, a gate for receiving the Enable signal in complementary form, and a drain connected to the Virtual $V_{SS}$ terminal. An N-channel transistor 46 has a drain connected to the Virtual $V_{SS}$ terminal, a gate connected to node 48, and a source connected to a terminal for receiving the $V_{SS}$ power supply. An N-channel transistor 50 has a drain connected to node 48, a gate for receiving the Enable signal in complementary form, and a source connected to the $V_{SS}$ terminal.

In operation, circuit 40 functions to provide either an original valued voltage $V_{SS}$ or an increased $V_{SS}$ supply voltage to power the circuit module 42. The complement form of the Enable signal (i.e. active low) directly determines which voltage, $V_{SS}$ or increased $V_{SS}$ is coupled to the circuit module 42. When the enable bar signal (i.e. the inverse of the enable signal) is a low logic value to place circuit module 42 of circuit 40 in an idle state of operation, transistors 44 and 50 are nonconductive and transistor 68 is conductive. The idle state of operation is a "drowsy" mode or an idle mode of operation in which circuit module 42 is sufficiently powered to maintain state information using an increased $V_{SS}$ voltage with a $V_{DD}$ supply voltage that is the same as in an active mode of operation. In the idle mode of operation, there is no normal circuit activity within the circuit module 42. Thus the term "idle" mode is herein used. The bias network 56 is enabled and node 76 is set at a bias voltage. Transistors 72, 70 and 66 form a current mirror circuit. The current that is flowing through transistors 70 and 72 is mirrored into transistors 60 and 66. The bias voltage of bias network 56 may assume various values and is determined by the physical and electrical characteristics of transistors 70 and 72. The first stage 52 has a gain element established by transistor 62. A gate-to-source voltage, $V_{GS}$, is established across transistor 62 on the Virtual $V_{SS}$ node. Transistor 60 functions as a load (i.e. also a current source) for transistor 62. The second stage 54 has a gain element that is established by transistor 64. Transistor 66 functions as a load for transistor 64. Transistor 46 provides a control gate for the first stage 52 and second stage 54 for providing an increased $V_{SS}$ to the Virtual $V_{SS}$ node. In this way, transistor 46 may be considered a third stage to the first stage 52 and second stage 54 with the circuit module 42 functioning as a load.

The voltage at the virtual $V_{SS}$ node is determined by the $V_{GS}$ of transistor 62. The desired voltage at the virtual $V_{SS}$ node is accomplished by the design of the physical and electrical characteristics of transistors 62 and 60. These characteristics primarily include the transistor channel dimensions and the transistor threshold voltage characteristic. During operation, if the Virtual $V_{SS}$ node drifts downward from the design's operating value, transistor 62 becomes biased weaker and the voltage at node 61 increases. This increase of voltage at node 61 biases transistor 64 weaker which in turn reduces the voltage bias applied to the gate of transistor 46 at node 48. Transistor 46 therefore is biased weaker which has the effect of increasing the voltage at the Virtual $V_{SS}$ node to counter the downward drift of voltage. If the Virtual $V_{SS}$ node drifts upward from the design's operating value, transistor 62 becomes biased stronger and the voltage at node 61 decreases. This decrease of voltage at node 61 biases transistor 64 stronger which in turn increases the voltage bias applied to the gate of transistor 46 at node 48. Transistor 46 therefore is biased stronger which has the effect of decreasing the voltage at the Virtual $V_{SS}$ node to counter the upward drift of voltage. These voltage relationships function as negative feedback to counter voltage changes (either up or down) at the Virtual $V_{SS}$ node. The negative feedback results from an odd number of stages wherein each stage implements a signal inversion between its input and output. The negative feedback response is determined by the loop gain of the product of the gains of the first stage 52, the second stage 54 and the transistor 46.

When the Enable BAR signal has a high logic value and circuit 40 is not in the Idle mode of operation, transistors 44 and 50 are conductive and transistor 68 is nonconductive. The high logic value of Enable BAR signal places the circuit module 42 in a normal mode of operation. In the normal mode of operation the normal or predetermined voltage value for $V_{SS}$ is connected to the Virtual $V_{SS}$ node by transistor 44. In this mode, the conduction of transistor 50 places the gate of transistor 46 at $V_{SS}$ to make transistor 46 nonconductive. Therefore, transistor 44 is the only transistor device connecting a voltage to the virtual $V_{SS}$ node. When transistor 68 is nonconductive, the bias voltage at node 76 is established at $V_{SS}$. The transistors 62 and 66 are nonconductive. Transistor 60 is made conductive under these operating conditions. As a result, node 61 is placed at the $V_{DD}$ potential and transistor 64 is therefore nonconductive. Since transistor 50 is conductive, the node 48 is placed at $V_{SS}$ which makes transistor 46 nonconductive. The circuit 40 remains operative until the Enable BAR control signal transitions back to a logic low value which indicates entrance into the Idle mode of operation.

Figure 3:
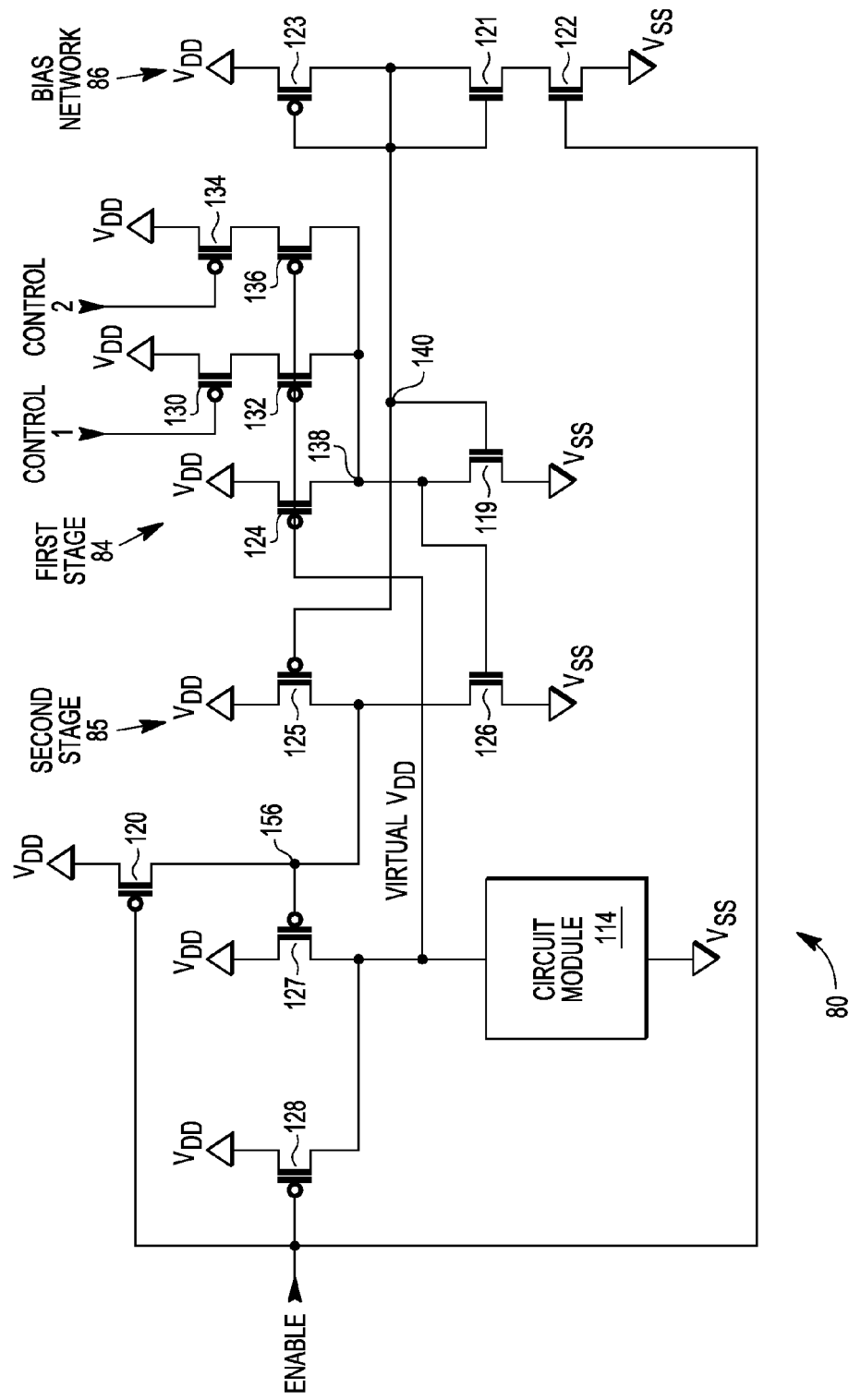
FIG. 3 illustrates in schematic form a circuit for voltage control in a semiconductor having a low power mode in accordance with another embodiment.

Illustrated in FIG. 3 is a circuit 80 for providing an operating voltage in accordance with yet another form of the present invention. Circuit 80 is programmable, such as by a user of a system incorporating circuit 80, for determining a value of operating voltage that is used during an idle mode of operation of a circuit module 114. The circuit module 114 has a first voltage terminal connected to a terminal for receiving a $V_{SS}$ voltage which, in one form, is an earth ground. A second voltage terminal of circuit module 114 is connected to a Virtual $V_{DD}$ node. A P-channel transistor 128 has a source connected to a terminal for receiving a supply voltage terminal for receiving supply voltage $V_{DD}$. The supply voltage $V_{DD}$ is more positive than the $V_{SS}$ supply voltage. A gate of transistor 128 is coupled to an Enable signal, and a drain of transistor is connected to the Virtual $V_{DD}$ node. A P-channel transistor 127 has a source connected to a supply voltage terminal for receiving supply voltage $V_{DD}$. A gate of transistor 127 is connected to a node 156 and a drain of transistor 127 is connected to the Virtual $V_{DD}$ node. A P-channel transistor 120 has a source connected to a terminal for receiving a supply voltage terminal for receiving supply voltage $V_{DD}$. A gate of transistor 120 is coupled to the Enable signal, and a drain of transistor 120 is connected to the gate of transistor 127 at node 156. An amplifier has a first stage 84 and a second stage 85 that are biased by a bias network 86. The bias network 86 has a P-channel transistor 123 having a source connected to a terminal for receiving the supply voltage $V_{DD}$. A gate of transistor 123 is connected to a drain thereof and to a node 140 for providing an output of the bias network 86. The drain of transistor 123 is connected to both a gate and a drain of an N-channel transistor 121. Both transistor 123 and 121 are therefore connected to form a diode. A source of transistor 121 is connected to a drain of an N-channel transistor 122. Transistor 122 has a gate for receiving the Enable signal and has a source connected to a terminal for receiving the supply voltage $V_{SS}$. Within the first stage 84, a P-channel transistor 124 has a source connected to a terminal for receiving the supply voltage $V_{DD}$. A gate of transistor 124 is connected to the Virtual $V_{DD}$ node. A drain of transistor 124 is connected to a drain of an N-channel transistor 119 at a node 138. A gate of transistor 119 is connected to node 140, and a source of transistor 119 is connected to a terminal for receiving the supply voltage $V_{SS}$. A P-channel transistor 130 has a source connected to a terminal for receiving the supply voltage $V_{DD}$. A gate of transistor 130 is coupled to a first control signal labeled 'Control 1'. A drain of transistor 130 is connected to a source of a P-channel transistor 132. A gate of transistor 132 is connected to the Virtual $V_{DD}$ node. A drain of transistor 132 is connected to node 138. A P-channel transistor 134 has a source connected to a terminal for receiving the supply voltage $V_{DD}$. A gate of transistor 134 is coupled to a second control signal labeled 'Control 2'. A drain of transistor 134 is connected to a source of a P-channel transistor 136. A gate of transistor 136 is connected to the Virtual $V_{DD}$ node. A drain of transistor 136 is connected to node 138. A second stage 85 has a P-channel transistor 125 having a source connected to a terminal for receiving the supply voltage $V_{DD}$. A gate of transistor 125 is coupled to the output of the bias network 86 at the node 140. A drain of transistor 125 is connected to the gate of transistor 127 at node 156 and to a drain of an N-channel transistor 126. A gate of transistor 126 is connected to an output of the first stage 84 by being connected to the drain of transistor 124 at node 138. A source of transistor 126 is connected to a terminal for receiving the supply voltage $V_{SS}$.

In operation, circuit 80 functions to provide either a full supply voltage $V_{DD}$ or a reduced supply voltage to power the circuit module 114. The Enable signal directly determines which voltage, $V_{DD}$ or reduced $V_{DD}$ is coupled to the circuit module 114. When the Enable signal is a high logic value circuit module 114 is placed in an idle state of operation. Transistors 128 and 120 are nonconductive and transistor 122 is conductive. The idle state of operation is a "drowsy" mode or an idle mode of operation in which circuit module 114 is sufficiently powered to maintain state information at a reduced $V_{DD}$ supply voltage. In this mode of operation, there is no normal circuit activity within circuit module 114. The bias network 86 is enabled and node 140 is set at a bias voltage. Transistors 121, 123 and 125 form a current mirror circuit. The current that is flowing through transistors 121 and 123 is mirrored into transistors 119 and 125. The bias voltage of bias network 86 may assume various values and is determined by the physical and electrical characteristics of transistors 121 and 123. Unlike the implementation of FIG. 1, the first stage 84 has a programmable gain element established by transistor 124 and the selection via a plurality of control signals. Series-connected transistors 130 and 132 and series-connected transistors 134 and 136 form a programming circuit for setting the gate-to-source voltage of transistor 124. Series-connected transistors 130 and 132 and series-connected transistors 134 and 136 each form a transistor pair of P-channel devices. The transistor pairs are selectively enabled to conduct current by the user programmable control signals. It should be understood that any number of pairs of series-connected transistors may be connected to node 138 to provide current to node 138. When one or both of the illustrated pairs of series-connected transistors are enabled to conduct current in response to the control signals, the conducting transistors change the gate-to-source voltage, $V_{GS}$, of transistor 124. The additional coupling of transistors between the $V_{DD}$ power supply terminal and node 138 has the affect of changing the physical characteristics of transistor 124 by adding more effective channel width to the transistor 124. This additional channel width changes the $V_{GS}$. A change in the gate-to-source voltage of transistor 124 changes the voltage at the virtual $V_{DD}$ node because the $V_{GS}$ is related to the voltage at the virtual $V_{DD}$ node.

A gate-to-source voltage, $V_{GS}$, established across transistor 124 and any enabled pair of transistors coupled in parallel between $V_{DD}$ and node 138 is on the Virtual $V_{DD}$ node. Transistor 119 functions as a load (i.e. also a current source) for transistor 124 and any enabled pair of transistor connected to node 138. The second stage 85 has a gain element that is established by transistor 126. Transistor 125 functions as a load for transistor 126. Transistor 127 provides a control gate for the first stage 84 and second stage 85 for providing a reduced $V_{DD}$ to the Virtual $V_{DD}$ node. In this way, transistor 127 may be considered a third stage to the first stage 84 and second stage 85 with the circuit module 114 functioning as a load.

The voltage at the virtual $V_{DD}$ node is determined by the $V_{GS}$ of transistor 124 and any enabled pair of transistors coupled in parallel between $V_{DD}$ and node 138. The desired voltage at the virtual $V_{DD}$ node is accomplished by the design of the physical and electrical characteristics of transistors 124 and 119 and any enabled pair of transistors. These characteristics primarily include the transistor channel dimensions and the transistor threshold voltage characteristic. During operation, if the Virtual $V_{DD}$ node drifts downward from the design's operating value, transistor 124 and any enabled pair of transistors become biased stronger and the voltage at node 138 increases. This increase of voltage at node 138 biases transistor 126 stronger which in turn reduces the voltage bias applied to the gate of transistor 127 at node 156. Transistor 127 therefore is biased stronger which has the effect of increasing the voltage at the Virtual $V_{DD}$ node to counter the downward drift of voltage. If the Virtual $V_{DD}$ node drifts upward from the design's operating value, transistor 124 and any enabled pair of transistors becomes biased weaker and the voltage at node 138 decreases. This decrease of voltage at node 138 biases transistor 126 weaker which in turn increases the voltage bias applied to the gate of transistor 127 at node 156. Transistor 127 therefore is biased less which has the effect of decreasing the voltage at the Virtual $V_{DD}$ node to counter the upward drift of voltage. These voltage relationships function as negative feedback to counter voltage changes (either up or down) at the Virtual $V_{DD}$ node. The negative feedback results from an odd number of stages wherein each stage implements a signal inversion between its input and output. The negative feedback response is determined by the loop gain of the product of the gains of the first stage 84, the second stage 85 and the transistor 127.

When the enable signal has a low logic value, transistors 128 and 120 are conductive and transistor 122 is nonconductive. The enable signal places the circuit module 114 in a normal mode of operation. In the normal mode of operation the full supply voltage value, $V_{DD}$, is connected to the Virtual $V_{DD}$ node by transistor 128. In this mode, the conduction of transistor 120 places the gate of transistor 127 at $V_{DD}$ to make transistor 127 nonconductive. Therefore, transistor 128 is the only transistor device connecting a voltage to the virtual $V_{DD}$ node. When transistor 122 is nonconductive, the bias voltage at node 140 is established at $V_{DD}$. The transistors 124 and 125 are nonconductive. Transistor 119 is made conductive under these operating conditions. As a result, node 138 is placed at the $V_{SS}$ potential and transistor 126 is therefore nonconductive. Since transistor 120 is conductive, the node 156 is placed at $V_{DD}$ which makes transistor 127 nonconductive. A portion of the circuit 80 remains inoperative until the enable control signal transitions back to a logic high which indicates entrance into the Idle mode.

In another form of circuit 80, instead of using transistors 130, 132, 134, 136 to program variation of the Virtual $V_{DD}$ node voltage, the current through transistor 119 can be varied to program the virtual $V_{DD}$ node voltage. In other words, transistor 119 may be implemented as a variable current source which also functions as a load. An advantage of either form of FIG. 3 is that circuit 80 may be utilized as a standard cell element in a standard cell library whenever a drowsy voltage controller is desired.

In another form of circuit 80, instead of using transistors 130, 132, 134 and 136 to program variation of the Virtual $V_{DD}$ node voltage, the bulk terminal of a MOSFET implementing transistor 124 could be varied to produce the desired change in the Virtual $V_{DD}$ voltage.

Figure 4:
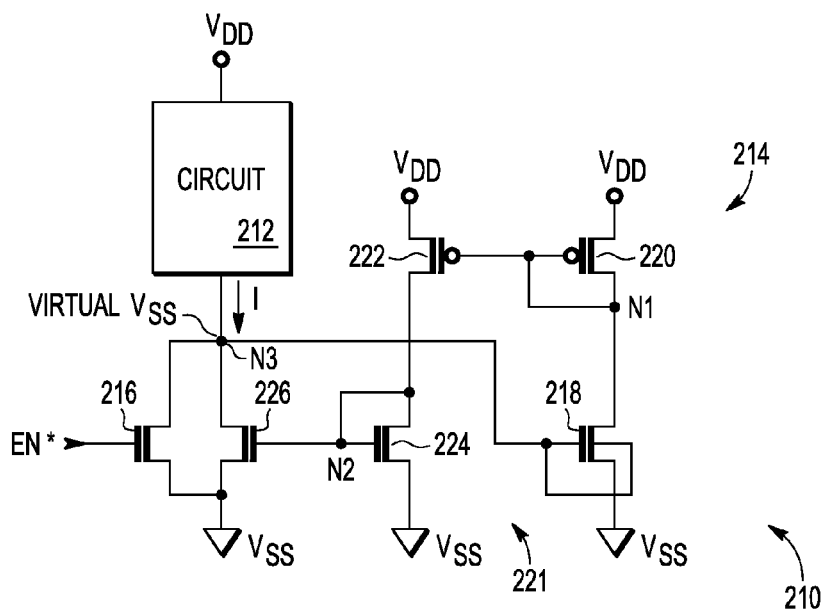
FIG. 4 illustrates in schematic diagram form a circuit for voltage control in accordance with another embodiment.

FIG. 4 illustrates in schematic diagram form a circuit 210 for voltage control in accordance with another embodiment. Circuit 210 includes circuit 212 and voltage regulator 214. Voltage regulator 214 includes disable transistor 216, sensing transistor 218, load transistor 220, transistors 222 and 224, and regulating transistor 226. Transistors 222 and 224 are coupled together to form an inverting stage 221. Transistors 216, 218, 224, and 226 are N-type MOS (metal oxide semiconductor) transistors and transistors 220 and 222 are P-type MOS transistors implemented on an integrated circuit. In one embodiment, circuit 210 is implemented using CMOS (complementary metal-oxide semiconductor) transistors on a silicon-on-insulator (SOI) substrate. In other embodiments, integrated circuit 210 can be implemented on another type of substrate using a different transistor type.

Circuit 212 can be any type of circuit that would benefit from leakage reduction during low power mode. For example, circuit 212 can be one or more logic circuits or a plurality of memory cells, or a combination of logic and memory. In one embodiment, circuit 212 is an array of static random access memory (SRAM) cells. Circuit 212 has a first power supply voltage terminal connected to $V_{DD}$ and a second power supply terminal connected to node N3. A leakage current labeled "I" will be present when circuit 212 is in a low power mode. In one embodiment, $V_{DD}$ is a positive power supply voltage equal to about 0.9 volts and $V_{SS}$ is generally ground. In another embodiment, $V_{DD}$ may be ground while $V_{SS}$ is negative. Also, in other embodiments, the power supply voltage may be any voltage. During low power mode the voltage at the $V_{SS}$ terminal is increased above ground to reduce the leakage current from circuit 212.

Disable transistor 216 has a first current electrode connected to a node N3 labeled "VIRTUAL $V_{SS}$", a control electrode connected to receive an enable signal labeled "EN*", and a second current electrode connected to a power supply voltage terminal labeled "$V_{SS}$". Sensing transistor 218 has a first current electrode connected to a node N1, a control electrode and a body terminal both connected to node N3, and a second current electrode connected to $V_{SS}$. In other embodiments, the body terminal of transistor 218 may be connected to another node, such as for example, $V_{SS}$. Load transistor 220 has a first current electrode connected to a power supply voltage terminal labeled "$V_{DD}$", a control electrode and a second current electrode both connected to the first current electrode of transistor 218 at node N1. P-channel transistor 222 has a first current electrode connected to $V_{DD}$, a control electrode connected to the control electrode of transistor 220, and a second current electrode. Transistor 224 has a first current electrode connected to the second current electrode of transistor 222, a control electrode connected to the second current electrode of transistor 222, and a second current electrode connected to $V_{SS}$. Regulating transistor 226 has a first current electrode connected to the first current electrode of transistor 216, a control electrode connected to the control electrode of transistor 224 at node N2, and a second current electrode connected to $V_{SS}$. The body terminals (not shown) of N-channel transistors 216, 224, and 226 are connected to ground and the body terminals (not shown) of P-channel transistors 220 and 222 are connected to $V_{DD}$.

During a normal mode of operation, circuit 212 is active and receives a normal operating power supply voltage at $V_{DD}$. The enable signal EN* is negated as a logic high to make transistor 216 conductive, thus connecting node N3 to $V_{SS}$ so that node N3 is at substantially $V_{SS}$. Transistor 218 is substantially non-conductive as node N3 is at substantially VSS potential. Node N1 is substantially $V_{DD}$ potential so that transistors 220 and 222 are substantially non-conductive. Node N2 is at VSS potential so transistors 224 and 226 are substantially non-conductive. Because transistors 218, 220, 222, and 224 are non-conductive, the leakage current or standby current is reduced. Note that the asterisk (*) after the signal name indicates that the signal is a logical complement of a signal having the same name but lacking the asterisk (*).

During a low power mode, enable signal EN* is asserted as a logic low voltage causing transistor 216 to be substantially non-conductive. Leakage current labeled "I" in FIG. 4 will cause the voltage at node N3 to increase. Transistors 220, 222, and 224 provide a feedback path from node N1 to node N2. Generally, the gate of sensing transistor 218 is coupled to sense the voltage at node N3. When transistor 218 responds to the increasing voltage, the feedback path controls the voltage at the control electrode of regulating transistor 226 to maintain the voltage at node N3 at a predetermined voltage level. The body terminal of transistor 218 is connected to node N3 so that an increasing voltage at node N3 lowered the threshold voltage (VT) of transistor 218. Lowering the VT is this manner improves the conductivity of the transistor 218 without increasing the size of transistor 218. In one embodiment with a power supply voltage of 0.9 volts, the predetermined voltage level is about 300 millivolts (mV) above $V_{SS}$, where $V_{SS}$ is at ground potential in the illustrated embodiment. In another embodiment, the predetermined voltage level is different. More specifically, during low power mode, the increasing voltage at node N3 will cause transistor 218 to start to become conductive, decreasing the voltage at node N1. The decreasing voltage at node N1 will bias transistors 220 and 222 to start to become conductive. When transistor 222 becomes conductive, the voltage at node N2 will increase. The increasing voltage at node N2 will cause transistor 226 to be conductive and reduce the voltage at node N3. Thus, regulating transistor 226 will maintain the voltage at node N3 the predetermined voltage level above $V_{SS}$.

Because the power supply voltage is already very low (e.g. 0.9 volts), and due to variations in the process and the electrical characteristics of the transistors and the power supply voltage, the data state of circuit 212 may become easily corruptible, or unstable, when transitioning from a normal mode to a low power mode. In the case where circuit 212 is an SRAM array, increasing the voltage at node N3 too much can reduce margins to the point where memory cells inadvertently change logic states. Therefore, it is important that the voltage at node N3 transition smoothly and without any overshoot of the predetermined voltage above ground. In voltage regulator 214, transistors 222 and 224 form a very low gain inverting stage so that the voltage transitions at node N3 are over-dampened. This functions to maintain adequate margins in the memory cells that would otherwise be compromised if the voltage at node N3 had any overshoot. Adding margin to accommodate any overshoot at node N3 would reduce the predetermined voltage above ground that the virtual VSS could rise. This would increase the amount of leakage current. Therefore, it is desirable to have a circuit that consumes a small current to regulate the voltage at N3 while having an over-dampened response (no overshoot), while also having adequate gain to maintain the voltage at node N3 at the predetermined voltage level above VSS.

Figure 5:
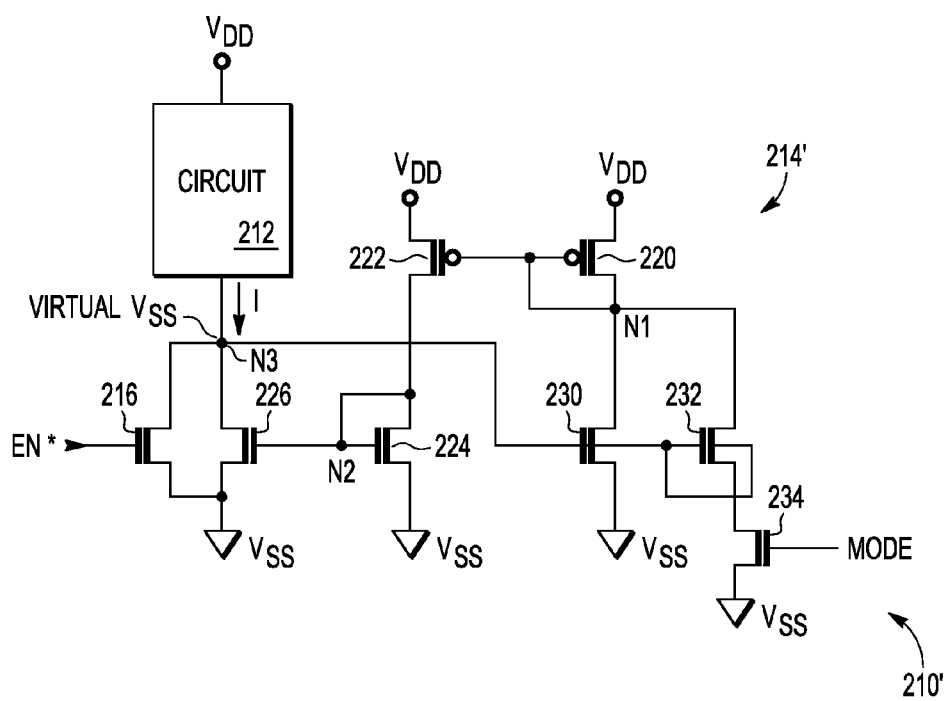
FIG. 5 illustrates in schematic diagram form a circuit for voltage control in accordance with another embodiment.

FIG. 5 illustrates in schematic diagram form a circuit 210' for voltage control in accordance with another embodiment. Circuit 210' includes circuit 212 and voltage regulator 214'. Voltage regulator 214' differs from voltage regulator 214 in that voltage regulator 214' includes a pair of parallel connected transistors 230 and 232 in place of the single transistor 218 in voltage regulator 214. Also, transistor 232 can be enabled or disabled by asserting a mode signal MODE at a control electrode of transistor 234. Transistor 230 has a first current electrode connected to node N1, a second current electrode connected to $V_{SS}$, and a control electrode connected to node N3. Transistor 232 has a first current electrode connected to node N1, a second current electrode, a control electrode connected to the control electrode of transistor 230, and a body terminal connected to node N3. Transistor 234 has a first current electrode connected to the second current electrode of transistor 232, a second current electrode connected to $V_{SS}$, and a control electrode for receiving mode signal MODE. The body terminal of transistor 230 is connected to $V_{SS}$. Note that in FIG. 5, the body terminal of transistor 232 is connected to node N3. However, the body terminal of transistor 230 can be connected to node N3 instead of $V_{SS}$. Also, in other embodiments the body terminals of both of transistors 230 and 232 can be connected to node N3. In addition, in other embodiments, the body terminals of neither of transistors 230 and 232 are connected to node N3.

In operation, voltage regulator 214' functions similarly to voltage regulator 214 except that voltage regulator 214' can maintain node N3 (VIRTUAL VSS) at one of two different predetermined voltage levels. When operating in a low power mode and mode signal MODE is not asserted, transistor 234 is substantially non-conductive and only transistor 230 controls the voltage at node N1 in response to the voltage level at node N3 (VIRTUAL VSS) as described above in the discussion of FIG. 4. However, when operating in low power mode and mode signal MODE is asserted, transistor 234 is conductive and both transistors 230 and 232 work together to lower the voltage at node N1. This causes regulating transistor 226 to become more conductive than the embodiment describe above with respect to FIG. 4, so that the voltage at node N3 is pulled lower than if transistor 230 was working alone. In one embodiment, the voltage at node N3 is maintained at about 200 mV when mode signal MODE is asserted, and the voltage at node N3 is maintained at about 300 mV when mode signal MODE is negated.

Figure 6:
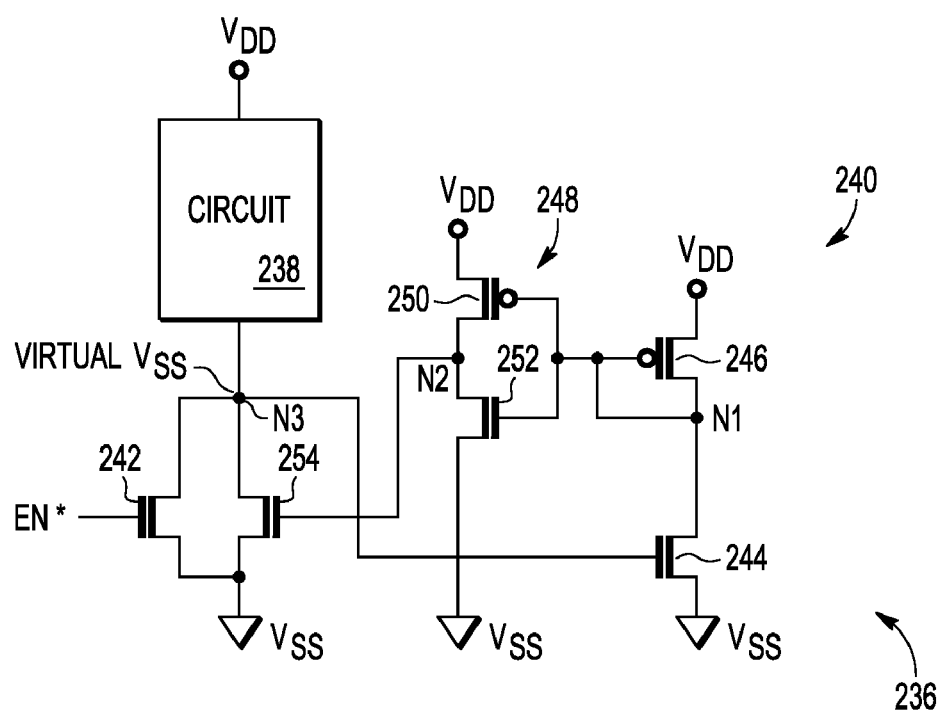
FIG. 6 illustrates in schematic diagram form a circuit for voltage control in accordance with another embodiment.

FIG. 6 illustrates, in schematic diagram form, a circuit 236 for voltage control in accordance with another embodiment. Circuit 236 includes circuit 238 and voltage regulator 240. Voltage regulator 240 includes N-channel transistors 242, 244, 252, and 254 and P-channel transistors 246 and 250.

Generally, integrated circuit 236 differs from integrated circuit 210 in FIG. 4 in that the inverting stage 221 of FIG. 4 is replaced with a CMOS inverter 248. Inverter 248 includes P-channel transistor 250 and N-channel transistor 252.

During a normal mode of operation, circuit 238 is active with switching transistors and receives a normal operating power supply voltage at $V_{DD}$. The enable signal EN* is negated as a logic high to make transistor 242 conductive, thus connecting node N3 to $V_{SS}$ so that node N3 is at substantially $V_{SS}$.

During a low power mode, enable signal EN* is asserted as a logic low voltage causing transistor 242 to be substantially non-conductive. The leakage current, labeled "I" will cause the voltage at node N3 to increase above ground. Transistor 246 and inverter 248 provide a feedback path from node N1 to node N2. Generally, the gate of sensing transistor 244 is coupled to sense the voltage at node N3. When transistor 244 responds to the increasing voltage at node N3, the feedback path controls the voltage at the control electrode of regulating transistor 254 to maintain the voltage at node N3 at a predetermined voltage level. In one embodiment with a power supply voltage of 0.9 volts, the predetermined voltage level is about 300 millivolts (mV) above ground. In another embodiment, the predetermined voltage level is different. More specifically, during low power mode, the increasing voltage at node N3 will cause transistor 244 to start to become conductive, decreasing the voltage at node N1. The decreasing voltage at node N1 will bias an input terminal of inverter 248 so that the output voltage of inverter 248 at node N2 will increase. The increasing voltage at node N2 will cause transistor 254 to be conductive and reduce the voltage at node N3. Thus, regulating transistor 254 will maintain the voltage at node N3 the predetermined voltage level above $V_{SS}$. Note that in another embodiment, a body terminal (not shown) of sensing transistor 244 may be connected to node N3 in a similar manner as transistor 218 in FIG. 4 and transistor 234 as illustrated in FIG. 5.

Because the power supply voltage is already very low (e.g. 0.9 volts), and because of variations in the process and electrical characteristics of the transistors and the power supply voltage, transitioning from a normal mode to a low power mode may cause the data state of circuit 238 to become easily corruptible. In the case where circuit 238 is an SRAM array, increasing the voltage at node N3 too much can reduce bit cell margins to the point where the bit cells inadvertently change logic states. Therefore, it is important that the voltage at node N3 transition smoothly to the predetermined voltage without overshooting the predetermined voltage. In voltage regulator 240, transistors 250 and 252 form a relatively low gain inverting stage so that the voltage transitions at node N3 are dampened less than the inverting stage 221 of FIG. 4. By using a relatively low gain inverting stage, overshoot of the predetermined voltage at node N3 can be avoided, and adequate margins in the memory cells can be maintained.

By now it should be appreciated that there has been provided various embodiments of a voltage circuit that accurately provides a reduced voltage and is size and power efficient. The voltage circuit described herein avoids the need of an operational amplifier or a reference voltage generator to establish an accurate voltage for a reduced power mode of operation. The virtual $V_{DD}$ and virtual $V_{SS}$ voltage values of the various circuit embodiments described herein track with variations in the threshold voltage variations of transistors within a same circuit. For example, while the threshold voltages of transistors 27 and 24 of FIG. 1 each vary, they will vary proportionately and the effects are minimized so that the Virtual $V_{DD}$ voltage remains substantially unaffected by transistor threshold voltage variation. The embodiments described herein have circuit component characteristic variations have been largely compensated for and the reduced voltage value can be accurately established within a very small margin for variation. By using a self-biasing constant current load inverter with signal feedback, the virtual $V_{DD}$ or virtual $V_{SS}$ voltage is accurately regulated. For example, in FIG. 1 the signal feedback path is from the Virtual $V_{DD}$ node to the gate of transistor 24 which affects the voltage of node 35 which affects the bias of transistor 26 which affects the voltage of node 36 which affects the bias of transistor 27 which affects the Virtual $V_{DD}$ node. Since this biasing network tracks with threshold voltage changes, the stability of the value of the voltage of the Virtual $V_{DD}$ node is excellent. In all embodiments, the small amount of required circuitry (as opposed to a voltage regulator having an operational amplifier or voltage reference) is small in terms of circuit area and power consumption.

Although the invention has been described with respect to specific conductivity types or polarity of potentials, skilled artisans appreciate that conductivity types and polarities of potentials may be reversed. In an alternative any of the embodiments described herein may be implemented by reversing the conductivities of each of the transistors from what is shown. In such embodiments it should be understood that functionality of specific transistors also reverses. For example, the gain devices and the load devices will reverse in such alternate embodiments.

In other alternative forms of FIG. 1, additional circuitry (not shown) may be used to make both of transistors 28 and 27 conductive in response to the Enable signal being in an inactive low state. For example an inversion of the enable signal may be connected to the gate of an N-channel transistor that is connected between the gate of transistor 27 and $V_{SS}$. The additional N-channel transistor would connect $V_{SS}$ to the gate of transistor 27 when the enable signal is in an inactive low state which would bias transistor 27 on. In such an alternative form both transistors 28 and 27 would source current from the $V_{DD}$ supply to the Virtual $V_{DD}$ node and to circuit module 14.

In alternative forms of FIG. 2, additional circuitry (not shown) may be used to make both of transistors 44 and 46 conductive in response to the Enable bar signal being in an inactive high state. For example an inversion of the enable bar signal may be connected to the gate of a P-channel transistor that is connected between the gate of transistor 46 and $V_{DD}$. The additional P-channel transistor would connect $V_{DD}$ to the gate of transistor 46 when the enable signal is in an inactive high state which would bias transistor 46 on. In such an alternative form both transistors 44 and 46 would sink current to the $V_{SS}$ supply from the Virtual $V_{SS}$ node and from circuit module 14.

In other alternative forms of FIG. 3, additional circuitry (not shown) may be used to make both of transistors 128 and 127 conductive in response to the Enable signal being in an inactive low state. For example an inversion of the enable signal may be connected to the gate of an N-channel transistor that is connected between the gate of transistor 127 and $V_{SS}$. The additional N-channel transistor would connect $V_{SS}$ to the gate of transistor 127 when the enable signal is in an inactive low state which would bias transistor 127 on. In such an alternative form both transistors 128 and 127 would source current from the $V_{DD}$ supply to the Virtual $V_{DD}$ node and to circuit module 114.

It should further be understood that the loads described in all embodiments may be implemented as either an active load or a passive load. For example, the transistors 20 and 25 of FIG. 1 may be implemented either as active loads (transistors, thyristors, etc.) or as passive loads (resistive devices such as resistors, capacitive devices such as capacitors, etc.).

The term "coupled," as used herein, is not intended to be limited to a direct coupling or a mechanical coupling. Although the invention is described herein with reference to specific embodiments, various modifications and changes can be made without departing from the scope of the present invention as set forth in the claims below. For example, various types of transistors may be implemented, such as MOS (metal oxide semiconductor), bipolar, GaAs, silicon on insulator (SOI) and others. The amount of power supply voltage reduction can be adjusted according to specific application requirements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A voltage regulator, comprising:

a node;

circuitry coupled to the node for providing a current to the node;

a regulating transistor coupled between the node and a first power supply voltage terminal;

a disabling transistor coupled in parallel with the regulating transistor for selectively disabling the regulating transistor by directly connecting the first power supply voltage terminal to the node;

an inverting stage coupled between the first power supply voltage terminal and a second power supply voltage terminal, the inverting stage having an output connected to a control terminal of the regulating transistor, the inverting stage having an input;

a load transistor having a first current electrode coupled to the second power supply voltage terminal, and a control electrode and second current electrode connected together and coupled to the input of the inverting stage;

a sensing transistor having a first current electrode coupled to the second current electrode of the load transistor, a control electrode connected directly to the node and a second current electrode coupled to the first power supply voltage terminal;

an additional sensing transistor having a first current electrode coupled to the first current electrode of the sensing transistor, a control electrode connected to the node, and a second current electrode; and a mode select transistor having a first current electrode coupled to the second current electrode of the additional sensing transistor, a control electrode for receiving a mode control signal which selects one of a plurality of voltage amounts for voltage at the node to change when the disabling transistor is not disabling the regulating transistor, and a second current electrode coupled to the first power supply voltage terminal.

2. The voltage regulator of claim 1 wherein the control electrode of the additional sensing transistor is connected to a body of the additional sensing transistor.

3. The voltage regulator of claim 1 wherein the current provided by the circuitry is a leakage current which occurs during a low power operating mode.

4. A voltage regulator, comprising:
a node;
circuitry coupled to the node for providing a current to the node;
a regulating transistor coupled between the node and a first power supply voltage terminal;
a disabling transistor coupled in parallel with the regulating transistor for selectively disabling the regulating transistor by directly connecting the first power supply voltage terminal to the node;
an inverting stage coupled between the first power supply voltage terminal and a second power supply voltage terminal, the inverting stage having an output connected to a control terminal of the regulating transistor, the inverting stage having an input, wherein the inverting stage further comprises:
a first inverting stage transistor having a first current electrode coupled to the second power voltage terminal, a control electrode, and a second current electrode, and
second inverting stage transistor having a first current electrode coupled to the second current electrode of the first inverting stage transistor and to the control electrode of the regulating transistor for controlling the regulating transistor, a control electrode coupled to the control electrode of the first inverting stage transistor, and a second current electrode coupled to the first power supply voltage terminal;
a load transistor having a first current electrode coupled to the second power supply voltage terminal, and a control electrode and second current electrode connected together and coupled to the input of the inverting stage; and
a sensing transistor having a first current electrode coupled to the second current electrode of the load transistor, a control electrode connected directly to the node and a second current electrode coupled to the first power supply voltage terminal.

5. The voltage regulator of claim 4 wherein:
the disabling transistor and the sensing transistor are N-type conductivity transistors, the load transistor is a P-type conductivity transistor, and a first supply voltage coupled to the first supply voltage terminal is less positive than a second supply voltage coupled to the second power supply voltage terminal.

6. The voltage regulator of claim 4 wherein the first power supply voltage terminal is a ground reference terminal.

7. The voltage regulator of claim 4 wherein the regulating transistor, disabling transistor, load transistor and sensing transistor are silicon-on-insulator (SOI) transistors and the inverting stage is implemented with SOI transistors.

8. A voltage regulator circuit comprising:
a node;
circuitry coupled to the node for providing a current to the node;
a first transistor of a first conductivity type coupled between the node and a first power supply voltage terminal for regulating voltage at the node;
a second transistor of the first conductivity type coupled in parallel with the first transistor for selectively disabling the first transistor by directly connecting the first power supply voltage terminal to the node;
an inverting stage coupled between the first power supply voltage terminal and a second power supply voltage terminal, the inverting stage having an output connected to a control terminal of the first transistor, the inverting stage having an input;
a third transistor of a second conductivity type that is opposite the first conductivity type, the third transistor having a first current electrode coupled to the second power supply voltage terminal, and a control electrode and second current electrode connected together and coupled to the input of the inverting stage; and
a fourth transistor of the first conductivity type having a first current electrode coupled to the second current electrode of third transistor, a control electrode connected directly to the node and a second current electrode coupled to the first power supply voltage terminal,
wherein the inverting stage further comprises:
a fifth transistor of the second conductivity type having a first current electrode coupled to the second power supply voltage terminal, a control electrode to provide the input of the inverting stage and being coupled to the control electrode of the third transistor, and a second current electrode, and
a sixth transistor of the first conductivity type having a first current electrode coupled to the second current electrode of the fifth transistor for providing the output of the inverting stage, a control electrode coupled to the control electrode of the fifth transistor, and a second current electrode coupled to the first power supply voltage terminal.

9. The voltage regulator circuit of claim 8 wherein the current provided by the circuitry is a leakage current which occurs during a low power operating mode.

10. A voltage regulator circuit comprising:
a node;
circuitry coupled to the node for providing a current to the node;
a first transistor of a first conductivity type coupled between the node and a first power supply voltage terminal for regulating voltage at the node;
a second transistor of the first conductivity type coupled in parallel with the first transistor for selectively disabling the first transistor by directly connecting the first power supply voltage terminal to the node;
an inverting stage coupled between the first power supply voltage terminal and a second power supply voltage terminal, the inverting stage having an output connected to a control terminal of the first transistor, the inverting stage having an input;
a third transistor of a second conductivity type that is opposite the first conductivity type, the third transistor having a first current electrode coupled to the second power supply voltage terminal, and a control electrode and second current electrode connected together and coupled to the input of the inverting stage;
a fourth transistor of the first conductivity type having a first current electrode coupled to the second current electrode of third transistor, a control electrode connected directly to the node and a second current electrode coupled to the first power supply voltage terminal;

a fifth transistor of the first conductivity type having a first current electrode coupled to the second current electrode of the third transistor, a control electrode coupled to the control electrode of the fourth transistor and to the node, and a second current electrode; and a sixth transistor of the first conductivity type having a first current electrode coupled to the second current electrode of the fifth transistor, a control electrode for receiving a mode signal which selects one of a plurality of voltage amounts for voltage at the node to change when the second transistor is not conductive, and a second current electrode coupled to the first supply voltage terminal.

11. The voltage regulator circuit of claim 10 wherein the control electrode of at least one of the fourth transistor and the fifth transistor is directly connected to a body thereof.

* * * * *